(12) United States Patent
Sidhwa

(10) Patent No.: US 8,222,138 B2
(45) Date of Patent: Jul. 17, 2012

(54) METHOD AND STRUCTURE OF A THICK METAL LAYER USING MULTIPLE DEPOSITION CHAMBERS

(75) Inventor: Ardeshir J. Sidhwa, Scottsdale, AZ (US)

(73) Assignee: ST Microelectronics, Inc., Carrollton, TX (US)

( * ) Notice: Subject to any disclaimer, the term of this patent is extended or adjusted under 35 U.S.C. 154(b) by 0 days.

(21) Appl. No.: 12/698,006

(22) Filed: Feb. 1, 2010

(65) Prior Publication Data
US 2010/0130006 A1    May 27, 2010

Related U.S. Application Data

(62) Division of application No. 10/437,871, filed on May 13, 2003, now Pat. No. 7,675,174.

(51) Int. Cl.
H01L 21/768    (2006.01)

(52) U.S. Cl. .................. 438/653; 257/E21.584

(58) Field of Classification Search .................. 118/719; 427/255.1; 204/242
See application file for complete search history.

(56) References Cited

U.S. PATENT DOCUMENTS

| 4,514,265 A | 4/1985 | Rao et al. |
| 4,726,983 A | 2/1988 | Harada et al. |
| 4,910,580 A | 3/1990 | Kuecher et al. |
| 5,060,045 A | 10/1991 | Owada et al. |
| 5,108,951 A | 4/1992 | Chen et al. |
| 5,298,459 A | 3/1994 | Arikawa et al. |
| 5,310,699 A | 5/1994 | Chikawa et al. |
| 5,447,599 A * | 9/1995 | Li et al. ................ 216/17 |
| 5,470,787 A | 11/1995 | Greer |
| 5,587,336 A | 12/1996 | Wang et al. |
| 5,658,828 A | 8/1997 | Lin et al. |
| 5,773,359 A | 6/1998 | Mitchell et al. |
| 5,925,227 A * | 7/1999 | Kobayashi et al. ...... 204/298.25 |
| 6,130,449 A | 10/2000 | Matsuoka et al. |
| 6,218,302 B1 | 4/2001 | Braeckelmann et al. |
| 6,329,722 B1 | 12/2001 | Shih et al. |

(Continued)

FOREIGN PATENT DOCUMENTS

EP    0465152 A2    1/1992

(Continued)

OTHER PUBLICATIONS

Hawley, J., et al., "Solutions to Catastrophic Yield Problems in MCM-D Interconnect Production," IEEE, International Conference on Multichip Modules and High Density Packaging, 1998, pp. 118-123.

(Continued)

*Primary Examiner* — David Vu
*Assistant Examiner* — Jonathan Han
(74) *Attorney, Agent, or Firm* — Seed IP Law Group PLLC

(57) ABSTRACT

A thick metal layer is formed on a semiconductor integrated circuit in multiple different deposition chambers. A first portion of the metal layer is formed in a first deposition chamber, the first thickness being approximately half the target thickness. The substrate is then removed from the first chamber and transported to a second chamber. The deposition of the same metal layer continues in a second chamber, having the same grain structure and orientation. The second portion of the metal layer is grown to achieve the final thickness. By using two different deposition chambers to form the single metal layer, layers in excess of 25,000 angstroms in thickness can be obtained.

15 Claims, 8 Drawing Sheets

U.S. PATENT DOCUMENTS

| | | | |
|---|---|---|---|
| 6,451,179 B1 * | 9/2002 | Xu et al. | 204/192.15 |
| 6,476,491 B2 | 11/2002 | Harada et al. | |
| 6,504,237 B2 | 1/2003 | Noguchi et al. | |
| 6,649,522 B2 | 11/2003 | Farrar | |
| 6,667,552 B1 | 12/2003 | Buynoski | |
| 6,710,425 B2 | 3/2004 | Bothra | |
| 6,727,590 B2 | 4/2004 | Izumitani et al. | |
| 6,740,585 B2 * | 5/2004 | Yoon et al. | 438/680 |
| 6,747,355 B2 | 6/2004 | Abiru et al. | |
| 6,774,484 B2 | 8/2004 | Mimino et al. | |
| 6,781,238 B2 | 8/2004 | Nonaka | |
| 6,787,907 B2 | 9/2004 | Watanabe et al. | |
| 6,803,297 B2 * | 10/2004 | Jennings et al. | 438/530 |
| 2001/0040264 A1 * | 11/2001 | Ito | 257/486 |
| 2003/0038025 A1 * | 2/2003 | Ngan et al. | 204/192.17 |

FOREIGN PATENT DOCUMENTS

| | | |
|---|---|---|
| EP | 0655780 A1 | 5/1995 |
| JP | 57-154858 | 9/1982 |
| JP | 61-251153 | 11/1986 |
| JP | 02-253628 | 10/1990 |
| JP | 04-133330 | 5/1992 |
| JP | 05-013421 | 1/1993 |

OTHER PUBLICATIONS

Igarashi et al., "The Best Combination of Aluminum and Copper Interconnects for a High Performance 0.18 μm CMOS Logic Device," IEEE: International Electron Devices Meeting, Dec. 6-9, 1998, pp. 31.1.1-131.1.4.

Pan et al., "Integrated Interconnect Module Development," VMIC Conference, Jun. 18-20, 1996, pp. 46-51.

Quintana et al., "Thickness Effects on Aluminum Thin Films," Sociedad Mexicana de Ciencia de Superficies y de Vacio, Superficies y Vacio 9:280-282, Dec. 1999.

Quirk et al., "Semiconductor Manufacturing Technology," Chapter 12: Metallization, Prentice Hall, New Jersey, 2001, pp. 299-303.

Saxena, A.N., 1995 Proceedings Twelfth International VLSI Multilevel Interconnection Conference (VMIC), Santa Clara Marriott Hotel, Santa Clara, CA, VMIC Catalog No. 95ISMIC-104, Jun. 27-29, 1995, pp. 430-432.

Vergason et al., "Selection of Materials and Techniques for Performance Coatings," Society of Vacuum Coaters, 42nd Annual Technical Conference Proceedings, 1999, pp. 53-57.

* cited by examiner

METHOD AND STRUCTURE OF A THICK METAL LAYER USING MULTIPLE DEPOSITION CHAMBERS

CROSS-REFERENCE TO RELATED APPLICATION

This application is a divisional of U.S. patent application Ser. No. 10/437,871, filed May 13, 2003, now pending, which application is incorporated herein by reference in its entirety.

FIELD OF THE INVENTION

This invention is in the field of depositing metal on a semiconductor chip and more particularly to depositing very thick layers of metal using multiple deposition chambers.

BACKGROUND OF THE INVENTION

Semiconductor chips frequently have between two and seven layers of metal above the silicon. The metal layers provide interconnection to the various transistors in silicon as well as transmit power, clock, and data through various portions of the chip. In order to improve the circuit operation, it is often desirable to have very thick metal layers. Metal layers in excess of 18,000 angstroms, which is 1.8 microns, has particular benefits in certain type of technologies. For example, in certain high-speed, low-resistance applications, inductive coils for RF applications, power distribution, and other circuits, very thick metal is beneficial. Under well known semiconductor deposition processes, it is common to deposit metals in the range of 2,000-6,000 angstroms in thickness. However, depositing metal layers having an overall thickness greater than 15,000 angstroms creates a number of difficulties. As the deposited metal becomes taller on the wafer, defects begin to increase in various parts of the final circuit. In some instances, there are wafer breakages while in other instances, metal shorts may occur. Additional problems are encountered in the chamber which holds the wafer during the metal deposition. In some instances, the metal may be sufficiently thick that a layer of metal at the edge of the wafer connects between the wafer and the clamp holding the wafer such that the wafer sticks to the clamp. This wafer sticking problem leaves a residue on the clamp, and in the worst situations, may connect the wafer to the clamp so that it breaks, or to avoid breakage must physically dislodged in order to remove it. Another problem is the increase in the thermal budget of the chamber during deposition of a thick metal layer which causes many portions of the chamber to be subjected to a higher temperature for longer periods of time than is preferred. Another significant disadvantage is the throughput speed with which thick metal can be deposited. Only a few wafers can be processed at a time and significantly, more time is taken for the thick deposition step with respect to the chamber operation, resulting in a heavy throughput loss.

A further problem is the quality of the metal which is obtained during a thick deposition. With a very thick metal layer, the metal grains are often abnormal and discontinuities resulting in loss of yield due to abnormal grain growth become more frequent. In addition, as time passes during the deposition process the grain growth may vary drastically within the deposition chamber, causing a portion of the metal to have a bad grain structure compared to other portions in the metal layer potentially causing lower conductivity or, in worst cases, potential failure of the circuit during operation.

Despite the shortcomings, people in the industry continue to have the desire to deposit thick metal layers, in excess of 15,000 angstroms, and continue to make efforts to do so.

BRIEF SUMMARY OF THE INVENTION

According to principles of the present invention, a single thick metal layer is deposited using multiple deposition chambers. According to one embodiment, the metal is grown to a first thickness in a first deposition chamber under selected pressure and temperature conditions. After this first portion of the metal layer is grown, the wafer is transferred out of the first deposition chamber into a transfer chamber. From the transfer chamber, the wafer is moved into a second deposition chamber where additional metal is deposited in the same metal layer to a second thickness. The two metal deposition steps result in a single layer of metal which is contiguous and has lower conductivity and considerably greater thickness than has previously been possible with a single deposition chamber process.

According to preferred embodiment, the thickness of the metal layer is in the range of 25,000-30,000 angstroms, which corresponds to between 2.5-3 microns (10,000 angstroms equals 1 micron). Metal layers grown according to this technique have substantially higher reliability, no yield loss due to abnormal aluminum grains, and an assurance of high conductivity of all thick metal layers throughout the entire circuit. Additional advantages are obtained in the manufacturing process since low thermal budget of each chamber is needed and there is no wafer sticking or breakage problem. A further advantage is that there are no particular limitations on the process conditions and the single metal layer can be produced in two deposition process steps with the transfer step in between the depositions.

A further advantage is that the correct grain orientation is obtainable from the first to the second deposition processes so that the final layer is a single metal layer that has uniform and clean grain orientation throughout.

According to one embodiment of the present invention, a wafer is first placed in a de-gas chamber which helps to remove water vapor and other unwanted gasses from the wafer. A cleaning step is next, after which a titanium layer is deposited on the wafer to a thickness of about 100 angstroms. A first portion of the metal layer is then deposited to a thickness of approximately half the desired end thickness, for example, 10,000-12,000 angstroms in thickness. The first deposition process is carried out by first depositing a cold seed layer followed by a hot deposition at a slow speed. The wafer is then transferred out of the first deposition and into a second deposition chamber. In the second deposition chamber a second portion of the same metal layer is deposited, however, using different process steps than the first metal portion of the same metal layer. First, heat is applied in order to extend the grain boundaries so that a smooth grain transition can occur for the deposition of the second portion. A hot deposition is then carried out so as to match the grain structure of the first portion of the same layer. After the first, slow, high temperature deposition is carried out, then a faster, high temperature deposition is carried out within the second chamber in order to more rapidly grow a thick metal layer. The metal is deposited approximately to the same thickness as the first portion, for example, 10,000-12,000 angstroms, though in some instances, the second deposition may deposit considerably more metal than the first deposition process deposited. The final metal thickness in the range of 25,000-30,000 angstroms is obtained. The wafer is then transferred to another metal deposition chamber in which a different type of metal, such as titanium nitride, of 300 angstroms in thickness is deposited on top of the second metal layer.

The first and second metal layers are preferably aluminum or an aluminum alloy, such as aluminum-copper, or a tungsten alloy, a copper alloy or some other acceptable metal.

BRIEF DESCRIPTION OF THE SEVERAL VIEWS OF THE DRAWING(S)

DETAILED DESCRIPTION OF THE INVENTION

Figure 1:
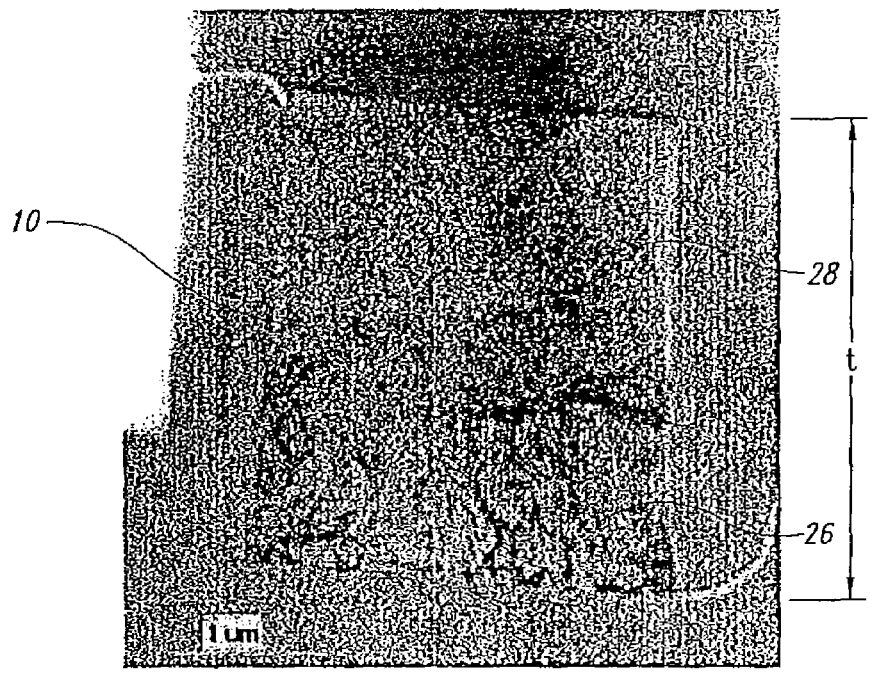
FIG. 1 is a cross-sectional view of a metal layer made according to principles of the present invention.

FIG. 1 illustrates a single metal layer made according to principles of the present invention. As can be seen in FIG. 1, it is a generally uniform metal layer 10 in the range of 25,000 angstroms in thickness, which is 2.5 microns. The layer shown in FIG. 1 has been made by deposition in two separate chambers at different times, one portion 26 of the layer being deposited first and a second portion 28 of the layer being deposited second. The deposition, having been done according to principles of the present invention does not have a separation between the first and second portions 26, 28 but rather is a single contiguous metal layer.

Figure 2:
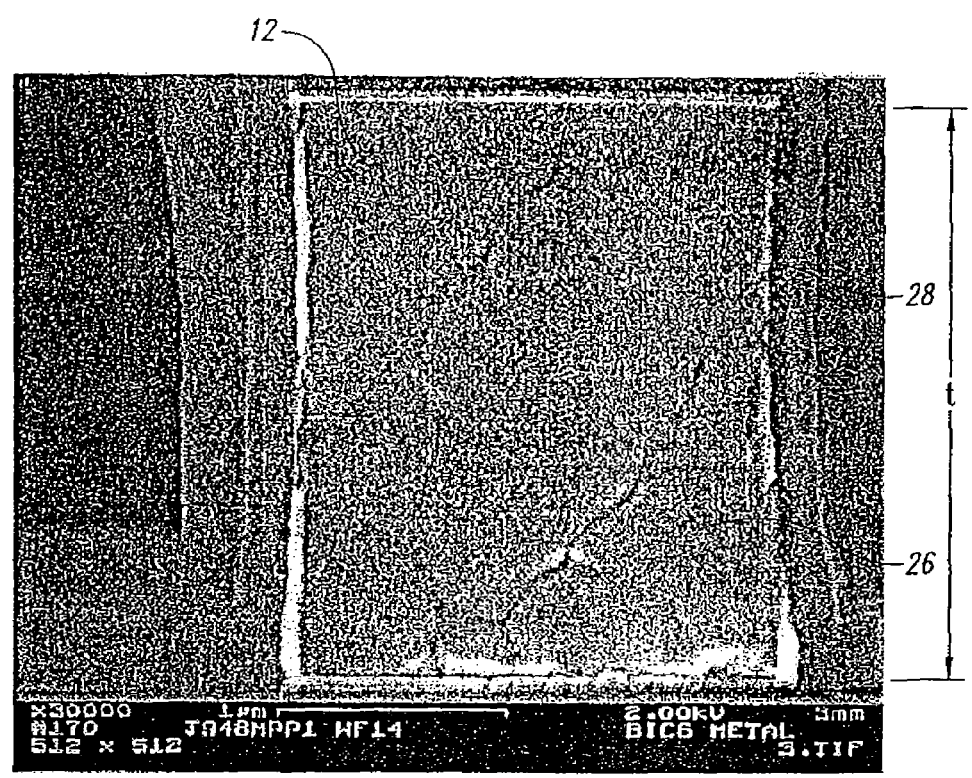
FIG. 2 is an enlarged cross-sectional view of a second metal layer made according to principles of the present invention.

FIG. 2 is a second example of a metal layer 12 made according to principles of the present invention. This metal layer has a thickness of in the range of 25,000-28,000 angstroms in thickness and has uniform grain throughout, having been made according to principles of the first embodiment of the present invention.

Some marks in the metal are clear in the photograph, but there are lines that extend diagonally based on other features in the metal. Even though the metal was grown in two chambers, one after the other, a contiguous single metal layer having the uniform grain structure and orientation has resulted, as can be seen from the photograph.

Figure 3:
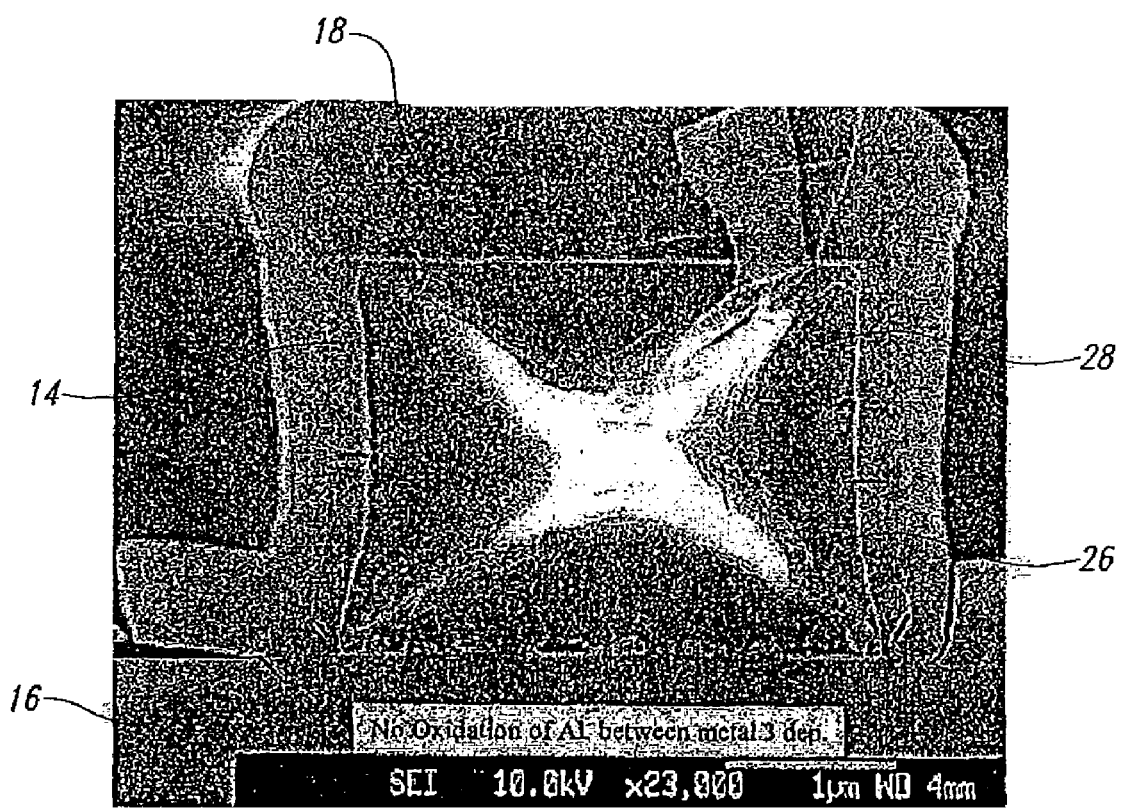
FIG. 3 is a cross-sectional view of a metal layer made according to one embodiment of the present invention.

FIG. 3 illustrates a further example of a metal layer 14 made according to principles of the present invention. This metal layer 14 is positioned on an underlying layer 16 and has a plurality of insulating layers formed into single layer 18 positioned on the sides and bottom. FIG. 3 illustrates that there is no oxidation of the aluminum in between the two portions 26, 28 of the metal deposition, the structure having been made according to principles of the present invention. The metal layer 14 as shown in FIG. 3 has been patterned and etched, after which the insulation layer 18 was formed thereover. This can be seen by viewing the layer 14, the grain is generally uniform throughout the entire thick layer and a distinct transition from one portion of the layer to another portion is not present. Rather, a single metal layer is obtained with uniform characteristics.

Figure 4:
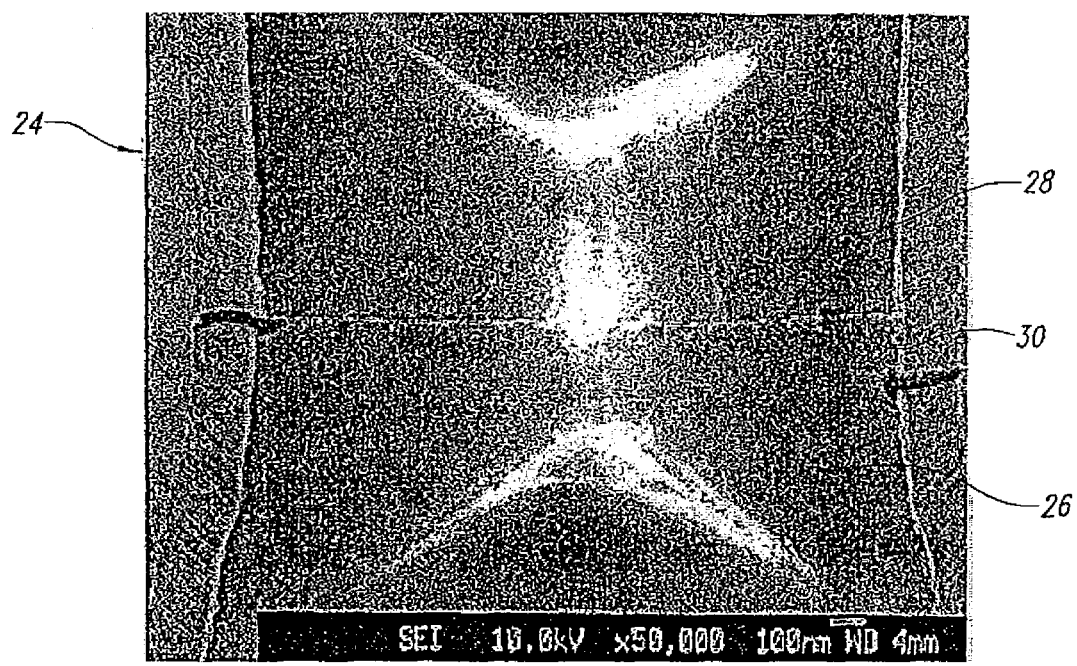
FIG. 4 is an exemplary embodiment of a layer of metal made according to another embodiment of the present invention.

FIG. 4 illustrates a thick metal layer made according to a second embodiment of the present invention. In the second embodiment, the metal layer 24 has a first portion, or sublayer, 26 and a second portion, or sublayer, 28. The first portion 26 is made in a first deposition chamber to a first thickness, in one embodiment until approximately in the range of 12,000-15,000 angstroms. The wafer is then removed from the first chamber and placed in an oxygen-containing atmosphere for a period of time. In one embodiment, the oxygen-containing atmosphere is ambient air and the wafer is placed at ambient air at local temperature and pressure for a period of time. For example, in the range of 1 minute to 2 hours. In the embodiment shown in FIG. 4, the wafer has been exposed to ambient air for approximately 2 hours, however, the time will usually be much shorter, such as 1 minute or less. During this exposure, a thin oxide layer 30 formed on top of the first metal portion 26 due to oxidation of the metal in the air. After the thin oxide layer 30 formed, the wafer was placed in the second chamber and the second portion of the layer 28 was deposited thereon. Even though a thin oxide layer 30 is formed in between the first portion 26 and the second portion 28 of the metal layer 24, the second metal deposition was in electrical contact with the first metal deposition such that the stack behaved as a single metal layer. The oxidation layer 30 was quite thin and, when voltage or current is placed on the metal layer 24, the entire layer 24 acts as a single metal layer and thus is an acceptable embodiment according to principles of the present invention. In some embodiments, the grain structure will not be uniform throughout and the orientation may change, but a single metal layer still results. Thus, even if the wafer is exposed to air or other oxygen containing atmosphere between the two depositions, an acceptable layer is obtained.

Figure 5:
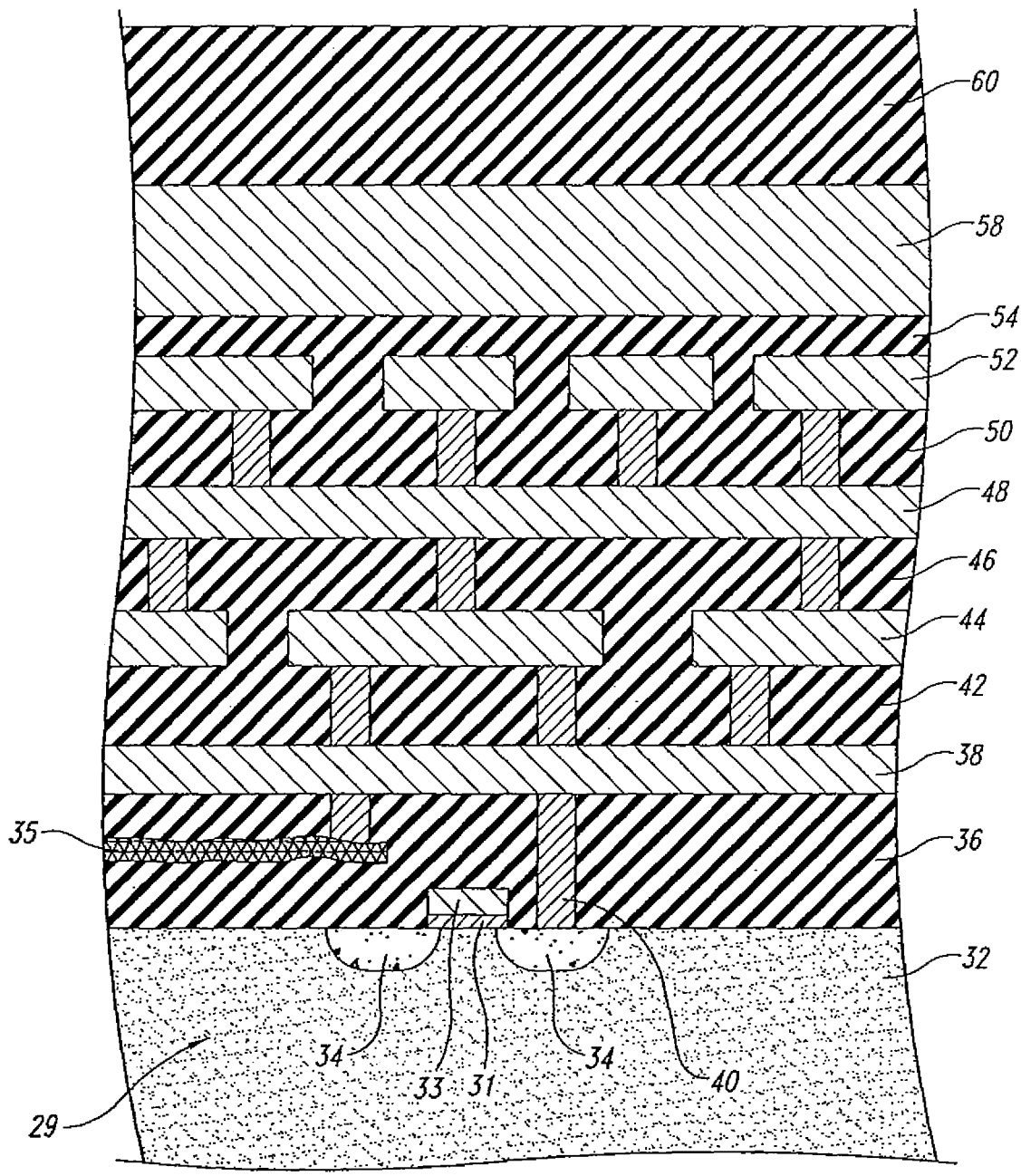
FIG. 5 is a cross-sectional view of multiple metal and insulating layers in which the fifth metal layer is made according to principles of the present invention.

FIG. 5 is a cross-sectional view of the plurality of metal and insulating layers according to principles of the present invention. A semiconductor substrate 32 is provided having one or more conductive regions 34 therein. A first insulating layer 36 is formed over the substrate over which is formed a first metal layer 38. As will be appreciated, one or more polysilicon layers forming the gates 33 of various transistors 29 having source/drain regions 34 may be positioned under the insulating layer 36. Only one such transistor is shown which has a polysilicon and metal silicide gate 33 and a gate oxide 31. As will be appreciated, numerous types of transistors, including MOS, DMOS, Bipolar, CMOS, and silicon germanium may be formed in the semiconductor substrate. While only one transistor is shown, any acceptable types of transistors 29 or conductive regions 34 may be formed and used in combination with the present invention. The invention is particularly useful with RF circuits and some circuits that contain germanium as a semiconductor.

One or more polysilicon layers 35 may be formed above the insulating layer 36.

A suitable interconnect structure 40, such as a tungsten plug, is used to connect the first metal layer to the conductive region 34 of the substrate 32. The formation of such a conductive plug 40 is well known in the art and any acceptable such connection connecting metal may be made. The first metal 38 can be any acceptable, such as tungsten or a tungsten alloy. An insulating layer 42 is positioned on top of the first metal layer 38 on top of which is a second metal layer 44. Overlying the second layer 44 is another insulating layer 46 on top of which is a third metal layer 48. Each of the metal layers 38, 44, and 48 may have approximately the same thickness of each other. The metal layers may be composed of any acceptable conductive metal, such as aluminum, aluminum-copper alloy (AlCu), copper, tungsten alloy or some other acceptable metal of the type well known in the art. Each of the metal layers 38, 44, and 48 will generally be in the range of 7,000-12,000 angstroms in thickness though, of course, some may be thinner and some slightly thicker. A preferred embodiment in some designs is approximately 8,000 angstroms in thickness. Generally, each of the first, second, third and fourth metal layers may have approximately the same thickness as each other.

According to principles of the present invention, an upper metal layer, in this example the fifth metal layer, has a thickness which is in excess of two times the thickness of at least one of the underlying metal layers. Preferably, the fifth metal layer has a thickness in the range of 25,000-28,000 angstroms. In some embodiments, one or more of the first to third metal layers will have a thickness and range of 8,000 angstroms. Thus, the fifth metal layer is approximately three times as thick as any such other metal layers.

Having a substantially thicker metal layer permits different structure to be constructed in a fifth metal layer for a particular circuit application. For example, an inductor can easily be made in the fifth metal layer, as can other RF circuit components.

According to one embodiment, the thick metal layer 58 is an upper layer on top of which is formed a further insulating layer 60 over which additional metal layers may be formed according to the techniques which have been described with respect to the lower layers in FIG. 5. According to an alternative embodiment, the thick metal layer 58 is the uppermost metal layer and no other metal layers are formed higher than it. In many embodiments, semiconductor chips have 6, 7, 8 or even more metal layers. Preferably, the thickest metal layer is usually the uppermost metal layer, though of course it can be an intermediate metal layer, such as metal 4 in a 5 metal process or metal 7 in an 8 metal process.

Placing the thickest metal layer as the uppermost metal layer has some significant advantages. Since the thick metal layer is the uppermost metal layer, it is not necessary to etching an opening through the fifth metal layer or form an interconnect therewith. Thus, using the uppermost metal layer as the thickest metal layer has some distinct advantages in fabrication of the semiconductor as well as circuit operation.

Figure 6:
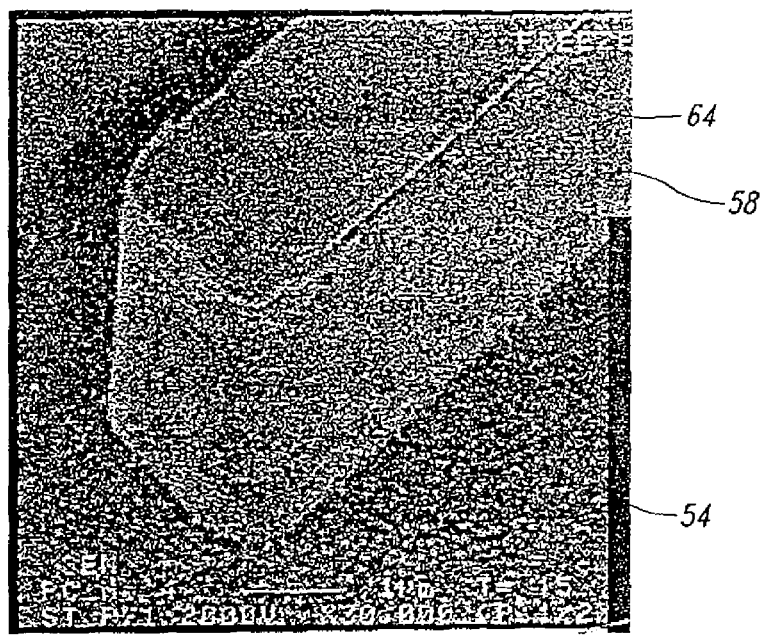
FIG. 6 is a three-dimensional view of a top metal connection line made according to principles of the present invention.
Figure 7:
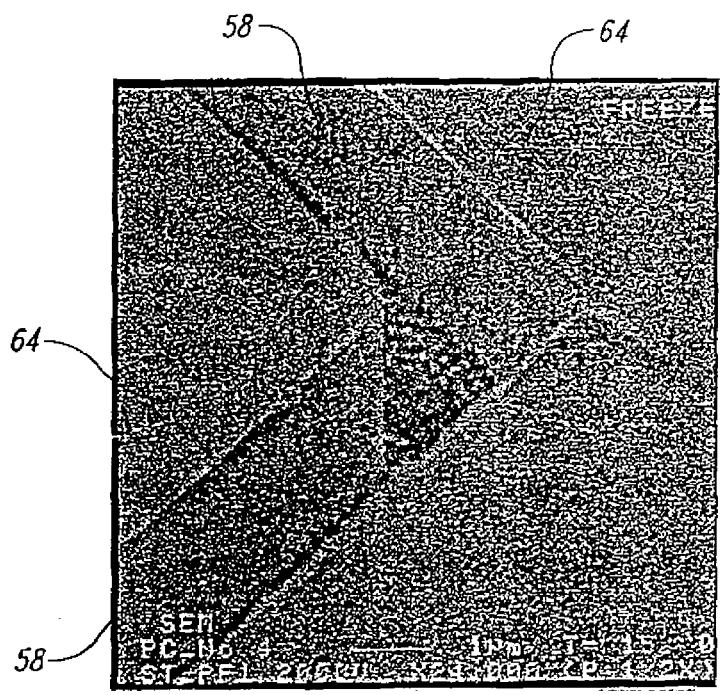
FIG. 7 is a perspective view of two metal interconnection lines, both of which have been made according to principles of the present invention.

FIGS. 6 and 7 are perspective SEM views of a thick metal layer formed according to principles of the invention. An insulating layer 54 is provided on top of which the metal layer 58 is formed. The metal layer is aluminum-copper alloy of between 20,000 angstroms and 25,000 angstroms in thickness. As previously noted, 1 micron equals 10,000 angstroms. A titanium nitride layer 64 is formed on top of the AlCu layer 58 in one embodiment. The layer 60 has been etched and patterned so as to form a metal interconnection layer of the desired configuration. As can be seen in FIG. 7, the metal layers can be etched to very small geometries, having line widths one-half or one-quarter of the thickness of the metal layer 58. As shown in FIG. 7, channels between adjacent metal connectors also having very small dimensions, less than 1 micron. The examples of FIGS. 6 and 7 are exemplary only and it will be appreciated that even smaller dimensions of the lateral width of the metal layer 58 and the spacing between adjacent metal connection strips can easily be performed, depending on the design rules of the semiconductor being manufactured.

Figure 8:
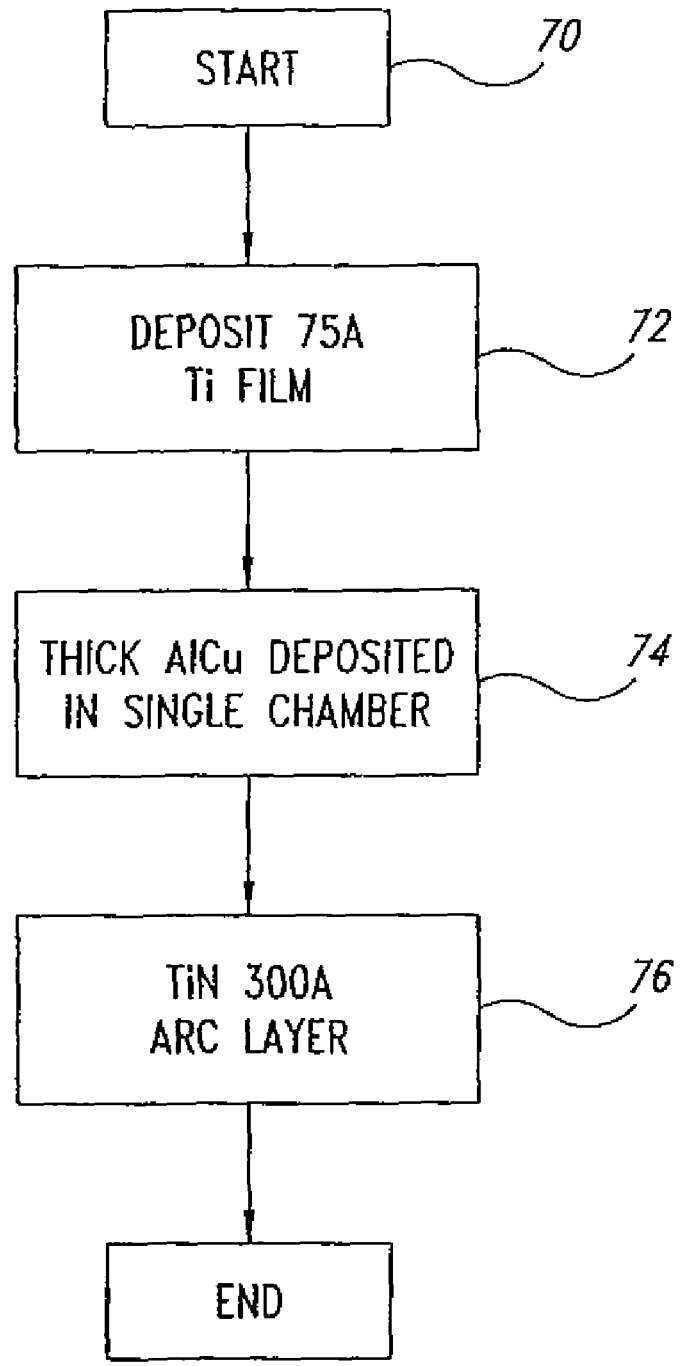
FIG. 8 is a flowchart of the prior art process for making metal lines.

FIG. 8 illustrates a flowchart of an exemplary prior art technique. When it was desired to obtain a thick aluminum layer, the recipe for this particular process started in step 70 followed by the deposition of a titanium film in step 72. Preferably, the titanium film was approximately 75 angstroms in thickness. Following this, in step 74, a thick aluminum layer was deposited in a single chamber. Such an aluminum alloy layer might be in the range of 10,000-25,000 angstroms. It was very difficult, and often not possible to reliably form aluminum alloy layers in excess of 25,000 angstroms based on the problems previously discussed. In order to improve the likelihood of obtaining an acceptable aluminum-copper layer in a single chamber, it was known in the art to begin the deposition of the aluminum with a cold seed process in which a small amount of aluminum was seed deposited onto the titanium film. After the cold seed layer was deposited, a slow hot deposition was carried out which increased the rate at which the aluminum was deposited onto the substrate. After carrying out the slow hot deposition for a period of time, a fast hot deposition was carried out at increased power so as to more rapidly grow the layer. Following the fast hot deposition step until the aluminum was at the end thickness, a titanium nitride layer of approximately 300 angstroms was deposited on the aluminum in step 76. As previously noted, the above prior art technique for forming the aluminum layer often resulted in grain discontinuities throughout the aluminum layer. As the layer became thicker, production of reliable layers having high yield became increasingly difficult. Consequently, the prior art often reduced the thickness of the layer in order to obtain higher yields thus not being able to obtain the technical advantages of a thick metal layer for those parts of the integrated circuit operation.

Figure 9:
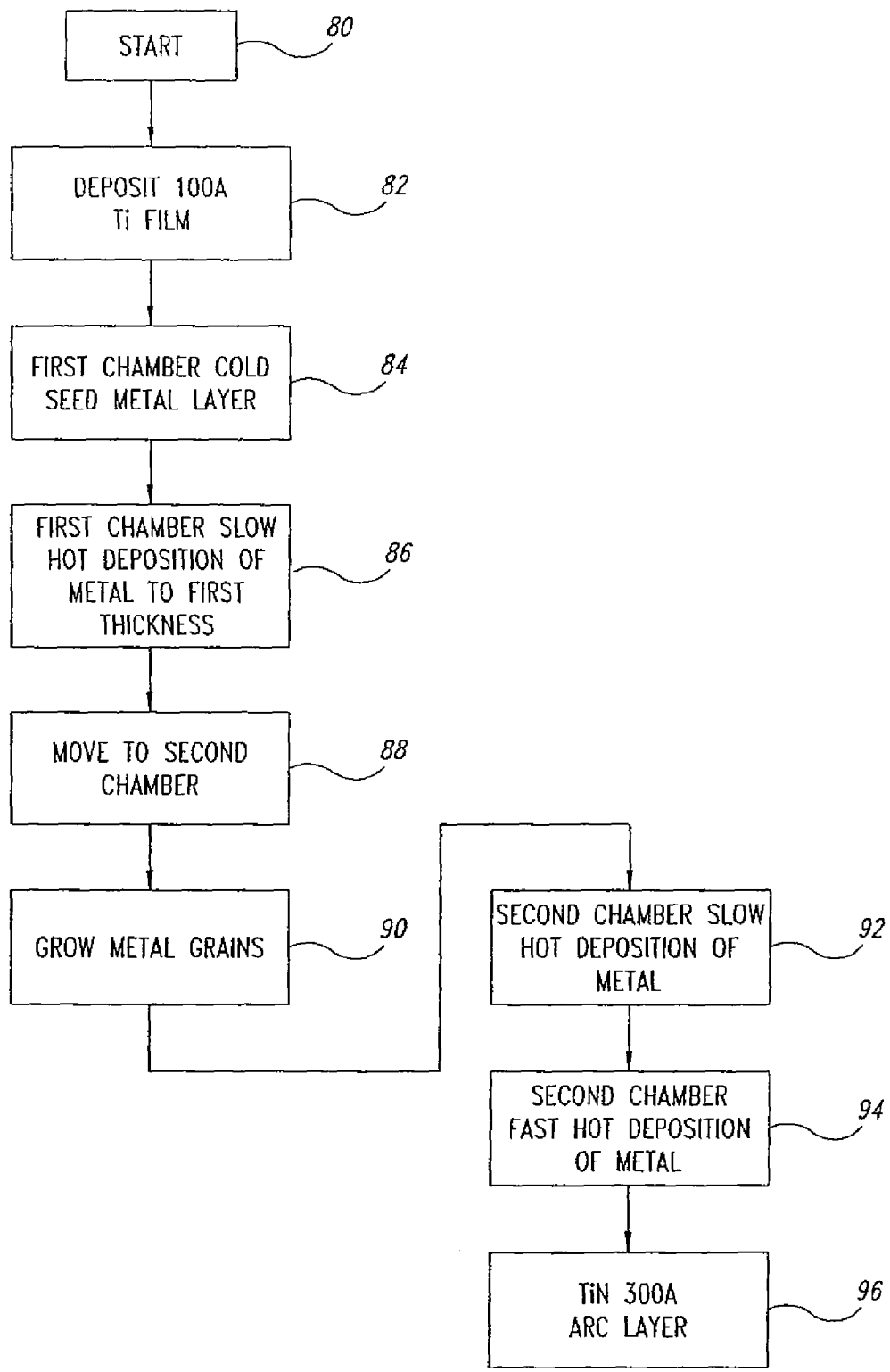
FIG. 9 is a flowchart according to one embodiment of the present invention.

FIG. 9 illustrates a process for forming a thick aluminum alloy layer according to a first embodiment of the second invention. At the start 80 of the recipe a wafer 99 (see FIG. 10) is placed into a first chamber and oriented to a desired position. This is done using a notch alignment technique as is known in the art. The wafer 99 may enter a chamber to degas any water vapor that may be present and ensure outgassing of other unwanted materials. The wafer 99 is then transferred to another chamber where a preclean step is carried out. The preclean step may be carried out by any acceptable techniques, such as a deionized water rinse, a cleaning etch under RF power, wet etch or other acceptable cleaning techniques. As is known, form time to time during the process steps the wafer may accumulate a very thin oxide layer, for example, 20 to 50 angstroms in thickness due to oxidation of the surface. Generally, such oxide layers are unwanted and it is desirable to remove the layers prior to proceeding to the next step. Accordingly, a preclean step is carried out in which the upper surface of the wafer 99 is etched or otherwise cleaned to remove any built up oxide or other layers thereon so as to expose the desired underlying layer, whether insulator or conductor.

Next, step 82, the wafer enters a first chamber in which a titanium layer is deposited. Preferably, the titanium layer has a thickness of approximately 100 angstroms, however, other thicknesses may be grown, such as 50-150 angstroms. The titanium film is grown with a crystal orientation of 111 so as to create the proper foundation layer. The titanium layer assists in controlling the grain boundary and orientation of the aluminum layer to be grown thereafter. The next chamber is then prepared to receive the wafer during which the first portion of the metal deposition will occur in step 84. In preparation for receiving the wafer, the chamber is evacuated of gases as much as practically possible so as to have a very low pressure within the chamber. Preferably, the pressure is nearly a vacuum being in the range of $1\times10^{-8}$ Torr or less. It is desired to have the chamber at least evacuated sufficiently that the pressure is at $1\times10^{-6}$ Torr or less and, in a preferred embodiment, the pressure in the chamber is lower than $1\times10^{-8}$ Torr. Having a lower pressure in the chamber reduces the chances of growing a thin oxide layer as the wafer is passed into the deposition chamber. Any prechamber in which the wafer is positioned is similarly evacuated of air so that the chamber from which the chamber is transferred in is also at a low pressure, similar to that of the deposition chamber so as to maintain the deposition chamber at a low pressure when the wafer enters.

Figure 10:
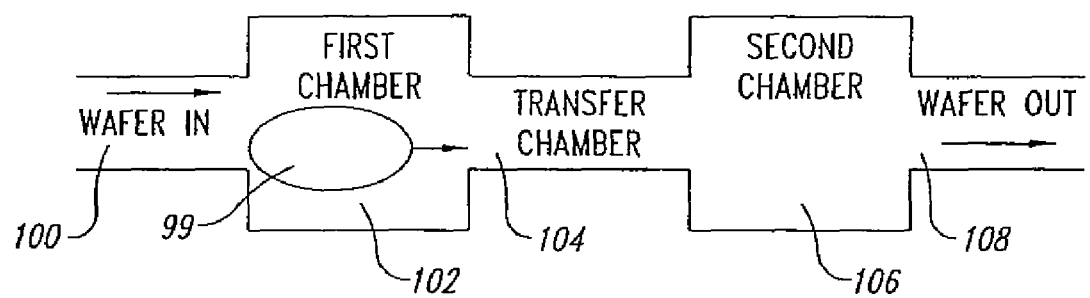
FIG. 10 is a schematic representation of an apparatus for carrying out the present invention.

Turning now to FIG. 10 and following the steps in FIG. 9, the wafer 99 is within an incoming transfer chamber 100 as it is prepared to enter the first chamber 102 for the deposition of the first layer of aluminum. Upon entering the first chamber 102 in step 84, the wafer is held in the proper position with a wafer clamp, a chuck or other acceptable equipment. The first chamber 102 is preheated to a temperature of 450° C. so as to provide a hot ambient environment for the aluminum deposition. During the first part of the process step, the gas flow is stabilized during which a small amount of argon gas is flowed into the chamber. In one embodiment, the room temperature argon gas is 55 scc which is flowed in for 5 seconds. During the flow-in, deposition does not occur and the DC power is zero. This flow of argon gas causes the pressure in the chamber to rise to approximately $1\times10^{-3}$ Torr. Following the gas purge flow for approximately 5 seconds, a cold deposition of aluminum is carried out for approximately 12 seconds. During the cold deposition of aluminum, power at a rate of approximately 14,000 watts is applied to the wafer and a cold seed layer is created. The cold seed layer is formed in this manner to obtain grain boundaries oriented with respect to the underlying titanium layer. The wafer enters the chamber at a wafer temperature of about 100° C. and the wafer takes between 30 to 40 seconds to begin to heat up. Thus, during the cold seed layer the wafer is not yet at a high temperature and the aluminum deposition rate in the range of approximately 220 angstroms per second. The flow of cold argon continues, at the rate of 55 scc during the cold seed layer step. The cold seed layer is grown until a desired thickness is obtained, usually in the range of 8 to 15 seconds, with a preferred time being approximately 12 seconds. In some embodiments, the cold seed layer may be grown for a shorter period of time, for example, less than 5 seconds so that its total thickness is less than 400 angstroms.

As the wafer is in the chamber, it begins to heat up. In addition, at the conclusion of the cold seed layer step, hot argon gas is flowed into the chamber at the bottom of the wafer so as to more rapidly heat the wafer to carry out a hot deposition step. For example, hot argon may be flowed in at a rate of 15 scc and the cold argon at a rate of 40 scc. The power is at 4,000 watts thus carrying out a slow deposition of the aluminum in a hot deposition process. The hot deposition of aluminum at the slow rate continues for a desired period of time, in the range of 40-120 seconds in order to achieve a desired layer. In one embodiment, the hot deposition is carried out for approximately 60 seconds. This first deposition is at a slower rate at a relatively low power thus providing more consistent grain growth between the cold deposition layer and the hot deposition layer so as to have a contiguous, uniform metal layer without unusual grain boundaries or grain sizes therein. This forms the first portion 26 of the metal layer 12, as shown in FIG. 2. The remainder of the first portion 26 of the metal layer 12 may be completely grown using a slow growth rate under hot deposition conditions. The use of the heated argon gas, as well as the extended period of time within the chamber at 450° C. raises the wafer temperature to approximately that of 450° C. within the first minute that the wafer is in the chamber. The deposition of metal with a power of 4,000 watts can continue until the desired thickness is achieved. However, the time should be sufficiently low to avoid thermal problems in the first chamber 102 and in forming the overall layer 12. It is desired that the wafer does not spend an extended time period within the first chamber. Preferably, the time within the first chamber is less than 5 minutes and, in the preferred embodiment the total time in the first chamber is less than 2 minutes, including the gas stabilization step, cold deposition step and hot deposition step. In one embodiment, it is desired to deposit aluminum at a faster rate so that the wafer spends less time in the first chamber. In this embodiment, the DC power may be increased to increase the deposition rate. For example, the DC power may be increased to 10,000 watts while maintaining the hot argon gas flow of 15 scc and a cold argon gas flow of 40 scc. This substantially increases the rate at which the aluminum is deposited so that a relatively thick aluminum layer can be deposited in a shorter period of time. Of course, slightly less power or slightly more power may be applied to vary the deposition rate at different portions of the process as well as the temperature of the chamber and the temperature and ratio of hot argon to cold argon gas.

The first portion 26 of the metal layer is deposited to a desired thickness depending on the circuit being formed. Preferably, the first portion 26 is approximately 40%-50% of the desired end metal layer. Thus, the deposition is carried out until a thickness of approximately 10,000-15,000 angstroms is achieved.

Following the completion of the first aluminum sublayer 26, the first chamber is purged of gas and the argon is pumped out so as to restore the first chamber to a higher vacuum, preferably in the range of $1\times10^{-7}$ to $1\times8^{-8}$ Torr. In summary, the first metal deposition step is carried out in the following sequence. A purge of the chamber in argon gas for approximately 5 seconds followed by a cold seed growth step for approximately 10-15 seconds followed by a slow hot deposition step for approximately 40-80 seconds and, in some embodiments followed by a high-speed hot deposition step for approximately 20-60 seconds and a gas purge for approximately 5 seconds. The total time which the wafer spends in the first chamber is in the range of 100-600 seconds and, in a preferred embodiment is less than 180 seconds and in some embodiments may be less than 120 seconds.

The wafer then leaves the first chamber 102 and moves into a transfer chamber 104 in step 88. The transfer chamber is a small connecting chamber between the two deposition chambers so as to maintain the wafer at low pressure and ensure it is not exposed to ambient air or impurities. The transfer chamber is preferably evacuated to the same pressure as the same chamber following the deposition process, in the range of $1\times10^{-7}$ to $1\times10^{-8}$ Torr or lower. The wafer 99 leaves the transfer chamber 104 and enters the second chamber 106, also in step 88. Within the second chamber 106 a second portion 28, or sublayer 28, of the same first metal layer is deposited.

The second chamber 106 is maintained at a high temperature, such as 450° C., so as to facilitate the deposition of aluminum. When the wafer first enters the second chamber 106, it is held in the chamber at an elevated temperature without DC power applied and no deposition for a period of time. For example, it may be held for 10 seconds with heated argon gas at 450° C. This causes the aluminum grains of the first portion of the layer to grow and extend, step 90 of FIG. 9. Under normal circumstances, the growth of the aluminum grains is considered detrimental to a metal deposition process and steps are usually taken to reduce the growth of the aluminum grains during the deposition. However, in the two chamber deposition process according to one embodiment of the present invention it is desired to ensure that the grain orientation of second portion 28 of the second deposition sublayer 28 aligns correctly with the first portion 26 of the deposition layer so that discontinuities are not present. Accordingly, it is desirable to cause a small amount of grain growth so that when the subsequent deposition begins in the second chamber the second deposition layer will align with the grains of the first deposition layer to be of the same grain structure and also orientation and form one contiguous layer 12. Accordingly, for a short period of time the wafer is left in the second chamber under conditions that facilitate growth of the grains. This is achieved by having a higher ratio of hot argon gas to cold argon gas flow across the wafer while maintaining the wafer in the chamber. In one embodiment, hot argon gas at a volume of 20 scc and cold argon at a volume of 15 scc flows across the wafer thus maintaining a high temperature and encouraging the growth of the grains at the exposed surface of the first portion of the aluminum layer. The grains are grown for a short period of time, for example 5-20 seconds and, in a preferred embodiment 10 seconds or less. This short period of time is sufficient to slightly enlarge the grains so that subsequent metal deposition will be aligned with the grains of the prior metal step. The step to enlarge the grains is not necessary in all embodiments and the invention can be practiced without this step if desired.

Following the grain growth step, a slow hot deposition step 92 is carried out in which the metal is nucleated onto the grains of the first portion 26 of the metal layer 12. For example, a DC power of approximately 4,000 watts is applied during the first step 92 of the deposition of the second metal sublayer 28 in order to nucleate the new grains of the second portion 28 of the metal layer 12 onto the existing grains of the first portion 26 of the metal layer 12. The deposition continues for a desired time period in order to continue growth of the layer 12, for example in the range of 20-40 seconds.

During this time, the ratio of hot to cold argon gas can be reduced, if desired, for example to having approximately 15 scc of hot argon gas and 40 scc of cold argon gas. During the hot deposition carried out at a slow rate, the power can be maintained at approximately 4,000 watts or at a somewhat reduced power in order to ensure that a smooth contiguous layer is formed during the deposition process. According to one embodiment, the slow, hot deposition 92 in the second chamber is carried out for 30 seconds at 4,000 watts of power and then for an additional 30 seconds at 2,000 watts of power. Thus, the first portion of the deposition process is approximately 60 seconds in length though, its length may be varied depending on the desired thickness of the end metal layer to be deposited. Following the slow, hot deposition step 92, a rapid deposition in step 94 is carried out for a period of time to more quickly achieve the desired thickness. During the rapid deposition, the power is increased to 10,000 watts for a period of time until the desired thickness is achieved. For example, the rapid growth may be carried out for approximately 40-60 seconds in order to obtain a second portion of the metal layer having a thickness in the range of 12,000-18,000 angstroms and, in a preferred embodiment 12,500 angstroms. This results in a single metal layer 12 in the range of 25,000-30,000 angstroms in thickness having been formed in the two deposition chambers.

Following the growth of the metal layer, a titanium nitride layer is deposited to a thickness of approximately 300 angstroms using techniques known in the art.

According to one alternative embodiment, the wafer is transferred from the first chamber 102 to ambient air before entering the second chamber 106. It thus passes through a standard ambient atmosphere rather than via an evacuated transfer chamber. In this alternative embodiment, the wafer is removed from the first chamber by the appropriate robotic equipment and transferred to the second chamber which may be spaced some distance from the first chamber depending on the configuration of the equipment. During such a transfer process in which the wafer is completely removed from the evacuated chamber and placed in the ambient atmosphere a thin oxidation layer may grow on the exposed surface of the wafer, including the first metal layer. Even if such a thin layer grows, it does not disrupt the conductive properties or reliability of the single metal layer. By growing the grains in step 90 prior to forming the second sublayer 28, the effects of the thin oxide layer, even if present are substantially reduced so that the two portions 26, 28 of the metal layer behave as a contiguous metal layer and have the conductive and mechanical properties of a uniform metal layer. Thus, while it is preferred to transfer the wafer from the first chamber 102 to the second chamber 106 under the appropriate vacuum conditions and within transfer chamber 104, according to an alternative embodiment it may be transferred from the first chamber to the second chamber in an ambient atmosphere or one containing oxygen.

An advantage of the present invention is that a thick aluminum layer is obtained which may be used in a number of circuit components. One benefit of the present process is the achievement of the correct grain orientation during growth in the second chamber process following the growth in the first chamber process. The advantage of such a metal layer is that there are no yield losses due to abnormal aluminum grains, a low chamber thermal budget is achievable and wafer sticking and breakage problems are overcome. Of course, the process can be repeated in a third or more chambers to form a metal layer far in excess of 25,000 angstroms. In addition, the process conditions are conducive to high throughput and preventive maintenance is minimized. Such a metal layer is useful in such products as silicon germanium products, bipolar DMOS processes, bipolar CMOS processes. Preferably, the thick metal layer is the uppermost metal layer, such as metal 4, metal 5, metal 6 or higher.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

The invention claimed is:
1. A method of forming a metal layer, comprising:
depositing a first metal on a substrate to a first thickness in a first deposition chamber;

transferring the substrate out of the first deposition chamber;

moving the substrate into an environment having an atmosphere containing some oxygen after transferring the substrate out of the first deposition chamber;

forming a thin oxide layer on the first metal layer while in the atmosphere;

moving the substrate into a second deposition chamber different from the first deposition chamber; and depositing a second metal on the thin oxide layer, overlying the first metal to a second thickness in the second chamber, wherein the second metal is the same as the first metal to obtain said metal layer; and the first metal and second metal are electrically connected.

2. The method of growing the metal layer according to claim 1, further comprising:

cleaning the substrate before depositing the first metal.

3. The method of growing the metal layer according to claim 2, wherein the step of cleaning the substrate includes:

placing the substrate in a de-gas chamber to remove water vapor and other unwanted gasses from the substrate.

4. The method of growing the metal layer according to claim 1, further comprising:

depositing a titanium layer on the substrate prior to depositing the first metal.

5. The method of growing the metal layer according to claim 1, wherein the second thickness is approximately equal to the first thickness.

6. The method of growing the metal layer according to claim 1, wherein said metal layer thickness is in the range of 25,000-30,000 angstroms.

7. The method of growing the metal layer according to claim 1, wherein said step of depositing the first metal is carried out by depositing a cold seed layer on the substrate followed by a hot deposition.

8. The method of growing a metal layer according to claim 1, further comprising:

placing a vacuum on the first chamber to a pressure in the range of $1 \times 10^{-6}$ Torr or less.

9. The method according to claim 8, wherein the pressure is in the range of $1 \times 10^{-8}$ Torr or less.

10. The method of growing a metal layer according to claim 1, wherein the step of depositing the second metal comprises the steps of:

applying heat to the substrate for a period of time without depositing metal;

depositing the second metal at a first rate in high temperature deposition; and depositing the second metal at a second rate faster than the first rate in a high temperature deposition.

11. The method of growing a metal layer according to claim 1, further comprising, after depositing the second metal, depositing another metal on the metal layer of a different type of metal from the metal layer.

12. The method of growing a metal layer according to claim 11, wherein said another metal is titanium nitride.

13. The method of growing a metal layer according to claim 1, wherein the metal layer is an aluminum alloy.

14. The method of growing a metal layer according to claim 1, wherein the metal layer is a tungsten alloy.

15. The method of growing a metal layer according to claim 1, wherein the metal layer is a copper alloy.

* * * * *

UNITED STATES PATENT AND TRADEMARK OFFICE
CERTIFICATE OF CORRECTION

PATENT NO. : 8,222,138 B2  Page 1 of 1
APPLICATION NO. : 12/698006
DATED : July 17, 2012
INVENTOR(S) : Ardeshir J. Sidhwa It is certified that error appears in the above-identified patent and that said Letters Patent is hereby corrected as shown below:

On the Title Page, Item (73):
"ST Microelectronics, Inc., Carrollton, TX (US)" should read, --STMicroelectronics, Inc., Coppell, TX (US)--.

Signed and Sealed this
Twenty-eighth Day of January, 2014

Michelle K. Lee
*Deputy Director of the United States Patent and Trademark Office*